United States Patent [19]

Tiemann

[11] 3,890,631

[45] June 17, 1975

[54] VARIABLE CAPACITANCE SEMICONDUCTOR DEVICES

[75] Inventor: Jerome J. Tiemann, Schenectady, N.Y.

[73] Assignee: General Electric Company, Schenectady, N.Y.

[22] Filed: Dec. 26, 1973

[21] Appl. No.: 428,394

[52] U.S. Cl. ........................ 357/14; 357/23; 357/24
[51] Int. Cl. ........................ H01l 17/00
[58] Field of Search ........................ 317/234, 235

[56] References Cited

UNITED STATES PATENTS

| | | | |
|---|---|---|---|
| 3,439,236 | 4/1969 | Blicher | 317/235 |
| 3,455,020 | 7/1969 | Dawson et al. | 317/235 |
| 3,564,355 | 2/1971 | Lehovec | 317/235 |
| 3,633,078 | 1/1972 | Dill | 317/235 |
| 3,735,156 | 5/1973 | Krambeck | 317/235 |
| 3,808,472 | 4/1974 | Engeler | 317/234 |

*Primary Examiner*—Michael J. Lynch
*Assistant Examiner*—E. Wojciechowicz
*Attorney, Agent, or Firm*—Julius J. Zaskalicky; Joseph T. Cohen; Jerome C. Squillaro

[57] ABSTRACT

A high frequency CIS capacitance device having a substrate of one conductivity type provides a capacitance for a high frequency signal applied across a pair of capacitance electrodes thereof which is dependent on the voltages applied to a pair of control electrodes, each connected to the surface adjacent region of the substrate underlying one of the pair of capacitance electrodes of the device through a respective channel region of opposite conductivity type. Means are provided for alternatively establishing one or the other channel regions of opposite conductivity type to establish values of capacitances dependent on the voltages applied to the control electrodes. Composite devices are formed of elemental devices such as described in which the capacitance of the composite device is the sum of the capacitance of the elemental devices and is variable in discrete increments to provide a large number of discrete values of capacitance in response to digital signals applied to a minimum number of control electrodes connected thereto.

11 Claims, 12 Drawing Figures

VARIABLE CAPACITANCE SEMICONDUCTOR DEVICES

The present invention relates in general to CIS (conductor-insulator-semiconductor) capacitance devices and in particular relates to such devices in which the capacitance provided thereby is variable in discrete increments.

This application is related to copending application Ser. No. 319,324, filed Dec. 29, 1972, now U.S. Pat. No. 3,808,472, assigned to the assignee of this application and incorporated herein by reference thereto.

A need exists in the art for a variable reactance element such as a solid state capacitor, the capacitance of which is variable in discrete steps from a minimum to a maximum value thereof for various applications. One application for such a variable reactance is in the television arts. It is desirable, particularly in the UHF transmission channels, that is, channels 14 thru 83, to provide resonant circuit tuning in the preamplifier and local oscillator stages which is accurately settable and which reliably tracks in response to control or tuning signals. In such a capacitor it is desirable that the minimum and the maximum capacitance values be precisely settable. It is also desirable that the variation of the capacitance produced by the control signal follow an arbitrary predetermined graph so that the resonant frequencies of the local oscillator and the preamplifier stages, each tuned by such a capacitor accurately track each other. It is further desirable that such a capacitor include few control leads and yet provide the large number of discrete values of capacitance needed. The present invention is directed to providing a variable solid state device fulfilling such a need.

An object of the present invention is to provide variable capacitance semiconductor devices for operation at high frequencies.

Another object of the present invention is to provide a variable capacitance semiconductor device which provides a large number of discrete values of capacitance in response to digital signals applied to control electrodes connected thereto.

Another object of the present invention is to provide a variable capacitance semiconductor device electrically controllable to provide a large number of discrete values of capacitance from a minimum to a maximum value of capacitance in which the minimum capacitance and the maximum capacitance can be accurately and reliably set and in which the increments of the capacitance between successive values of capacitance can also be accurately and reliably set thereby.

Another object of the present invention is to provide a voltage variable capacitance semiconductor device providing a capacitance which is relatively simple in construction and highly reliable in operation.

In carrying out the invention in one illustrative embodiment thereof, there is provided a substrate of semiconductor material of one type conductivity having a plurality of capacitance providing electrodes. Each of the capacitance providing electrodes is spaced a predetermined distance from a respective surface adjacent region of the substrate and forms a capacitor with respect to a common electrode connected to the substrate. Each surface adjacent region is spaced from the other surface adjacent regions sufficiently to permit a separate surface potential to be established therein. The capacitance providing electrodes are connected together to provide a common capacitance providing electrode of the device. This connection preferably has negligible impedance at the operating frequency so that all of the respective elemental capacitances behave as a single capacitive element. To this end, it is desirable that the capacitance providing electrodes be located as close together as possible on the substrate subject to the requirement that the respective surface potentials of the respective surface adjacent regions can be independently controlled. Means are provided for applying a depletion producing voltage between the common capacitance providing electrode and the common electrode to bias the surface adjacent regions beyond the inversion threshold potential thereof. Means are also provided for applying a high frequency signal between the common capacitance providing electrode and the common electrode. Control means are provided for establishing individually in each of the surface adjacent regions a first potential in relation to the substrate corresponding to a low value of capacitance between the respective capacitance providing electrode and the common electrode and for establishing alternatively and individually in each of the surface adjacent regions a second potential in relation to the substrate corresponding to a high value of capacitance between a respective capacitance providing electrode and the common electrode. The capacitance of the device is variable in increments depending on the particular potentials established in the surface adjacent regions of the capacitors from a minimum value corresponding to the sum of the low value capacitances of the capacitors when the first potential is established in all of the surface adjacent regions of the capacitors to a maximum value corresponding to the sum of the high value capacitances of the capacitors when the second potential is established in all of the surface adjacent regions of the capacitors.

The novel features which are believed to be characteristic of the present invention are set forth with particularity in the appended claims. The invention itself, both as to its organization and method of operation together with further objects and advantages thereof, may best be understood with reference to the following description taken in connection with the accompanying drawings wherein FIG. 1 shows a plan view of a semiconductor device including means for controlling the capacitance thereof to provide a low value capacitance when one set of control voltages is applied thereto and for providing a high value capacitance when another set of control voltages are applied thereto in accordance with one aspect of the present invention.

FIG. 2 shows a front elevation view in section of the semiconductor device of FIG. 1 including voltage biasing means and utilization circuits connected to the terminals of the semiconductor device.

FIG. 3 shows a family of graphs of potentials in the semiconductor device of FIGS. 1 and 2 as a function of distance normal to the surface of the semiconductor body underlying the first electrode thereof. Each graph represents the variation of potential from a most negative value at the surface to a minimum at the maximum depletion depth for respective surface potentials at the surface corresponding to particular charge densities thereat.

FIG. 4 shows three graphs each illustrating the manner in which the capacitance between the electrodes of the semiconductor device of FIGS. 1 and 2 varies as a function of the d-c operating voltage applied between the first and second electrodes for a respective control voltage applied to the surface adjacent region thereof. The particular control voltages selected provide the low and high values of capacitance desired.

Figure 5:
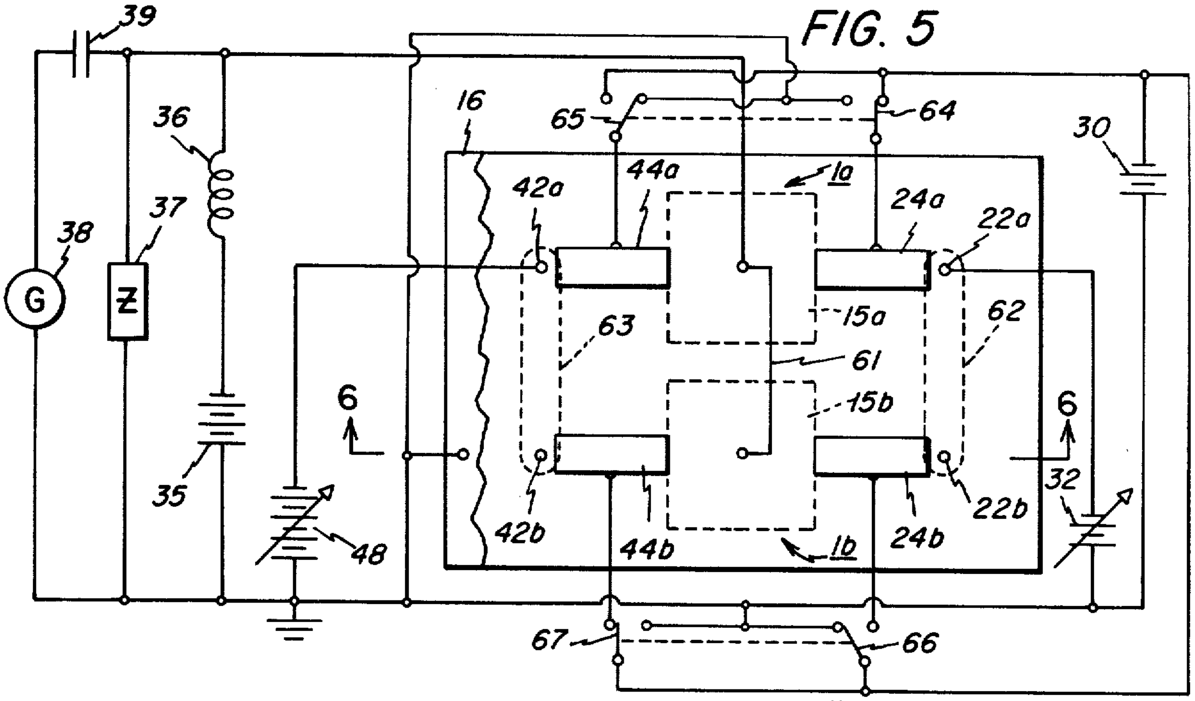
FIG. 5 shows another embodiment in accordance with the present invention including a pair of semiconductor devices such as shown in FIGS. 1 and 2 which are connected in circuit in a manner to provide a plurality of discrete values of capacitance in response to preset control signals applied to the controlled electrodes thereof.
Figure 7:
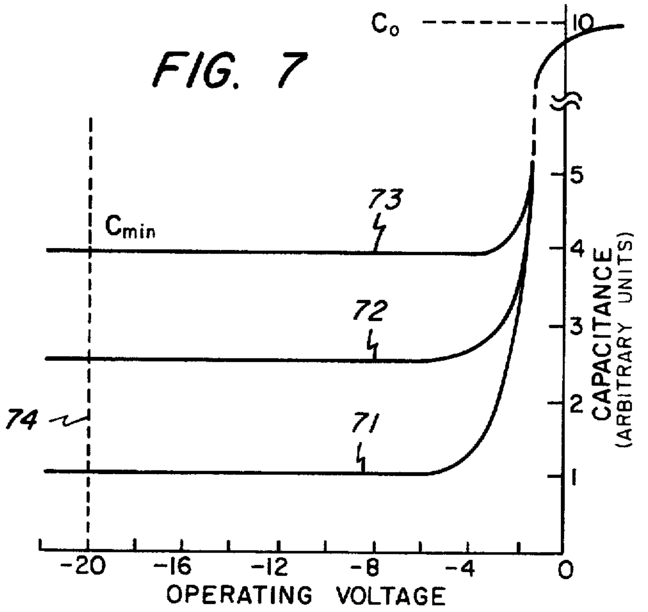

FIG. 7 shows a plurality of graphs, three in number, each illustrating the manner in which the capacitance between the electrodes of the semiconductor apparatus or the composite semiconductor device of FIG. 5 varies as a function of dc operating voltage applied between the first and second electrodes for each of three sets of control voltages applied to the four control electrodes of the device of FIG. 5.

Figure 1:
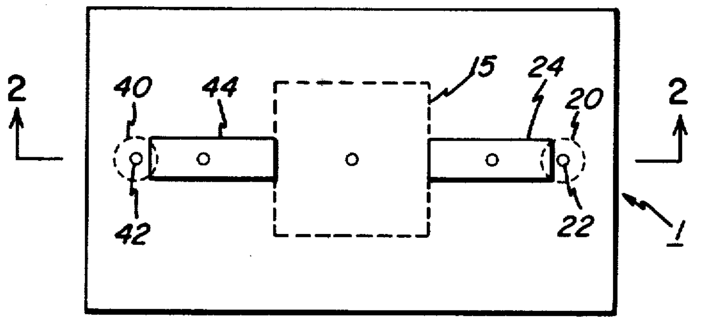
Figure 8:
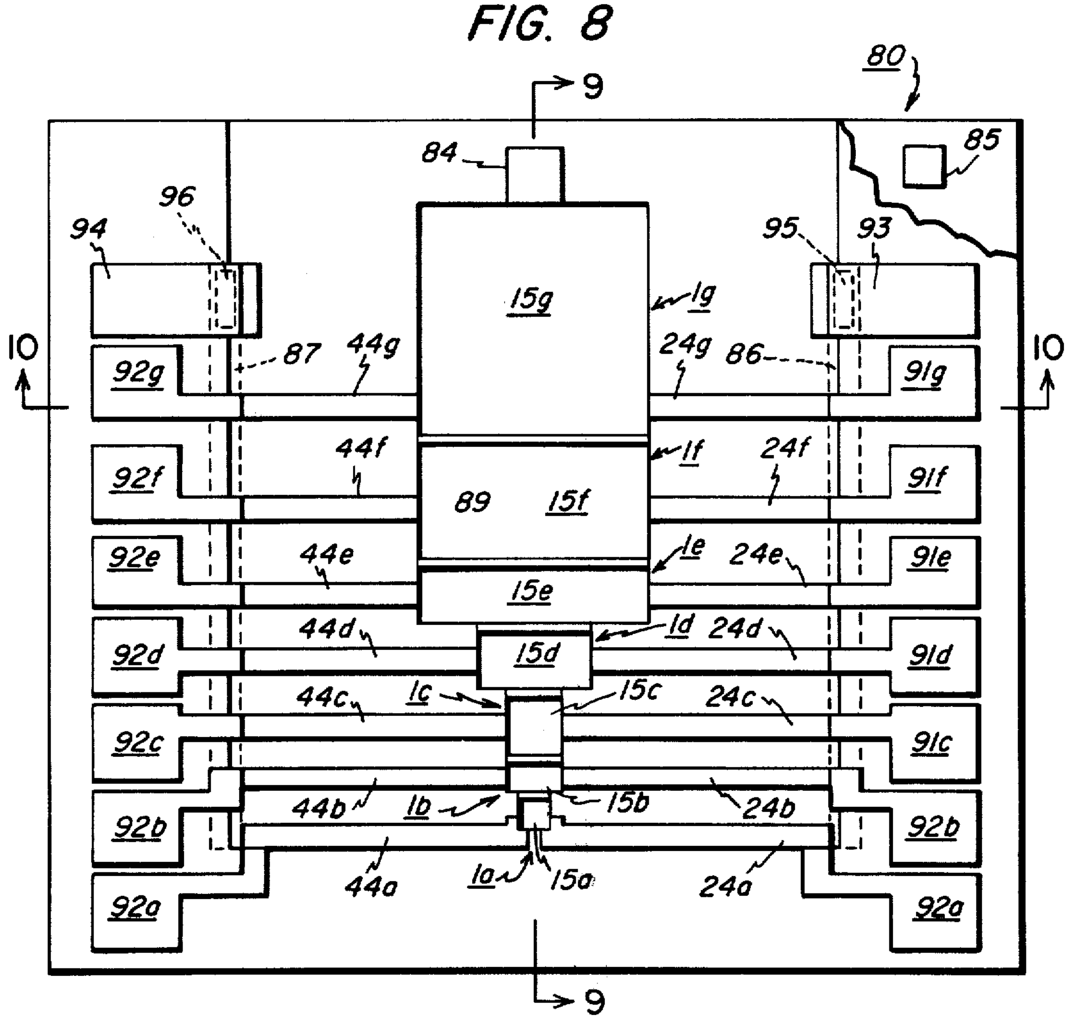

FIG. 8 shows another embodiment of the present invention including a plurality of semiconductor devices formed on a common substrate, each device having a construction such as shown in FIG. 1.

Figure 9:
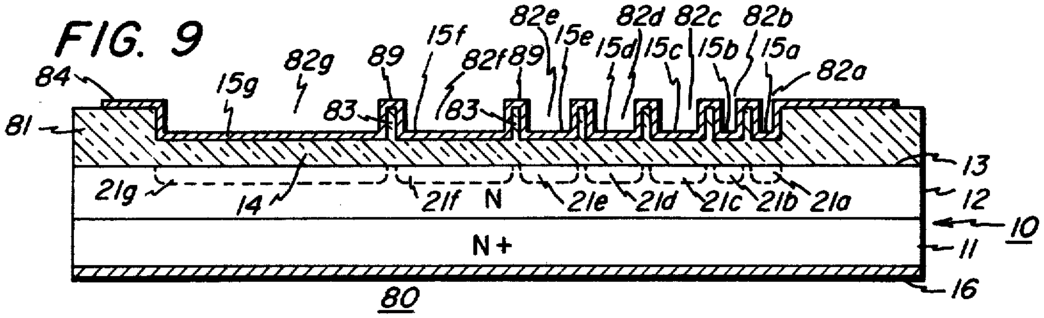

FIG. 9 is a sectional view of FIG. 8 taken along section lines 9—9 thereof.

Figure 10:
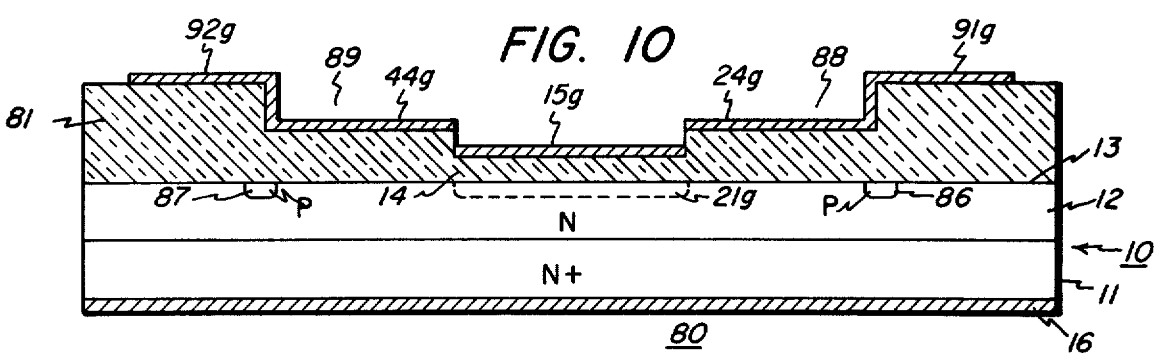

FIG. 10 is another sectional view of FIG. 8 taken along section lines 10—10 thereof.

Figure 11:
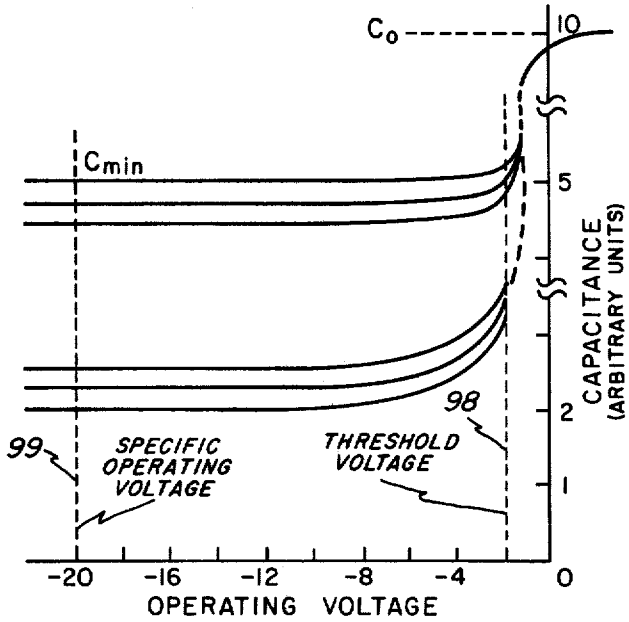

FIG. 11 shows a plurality of graphs, each illustrating the manner in which the capacitance between the capacitance providing electrodes of the composite semiconductor device of FIG. 8 varies as a function of dc operating voltage applied therebetween for respective sets of control voltages applied to the controlled electrodes of the composite device of FIG. 8.

Figure 12:
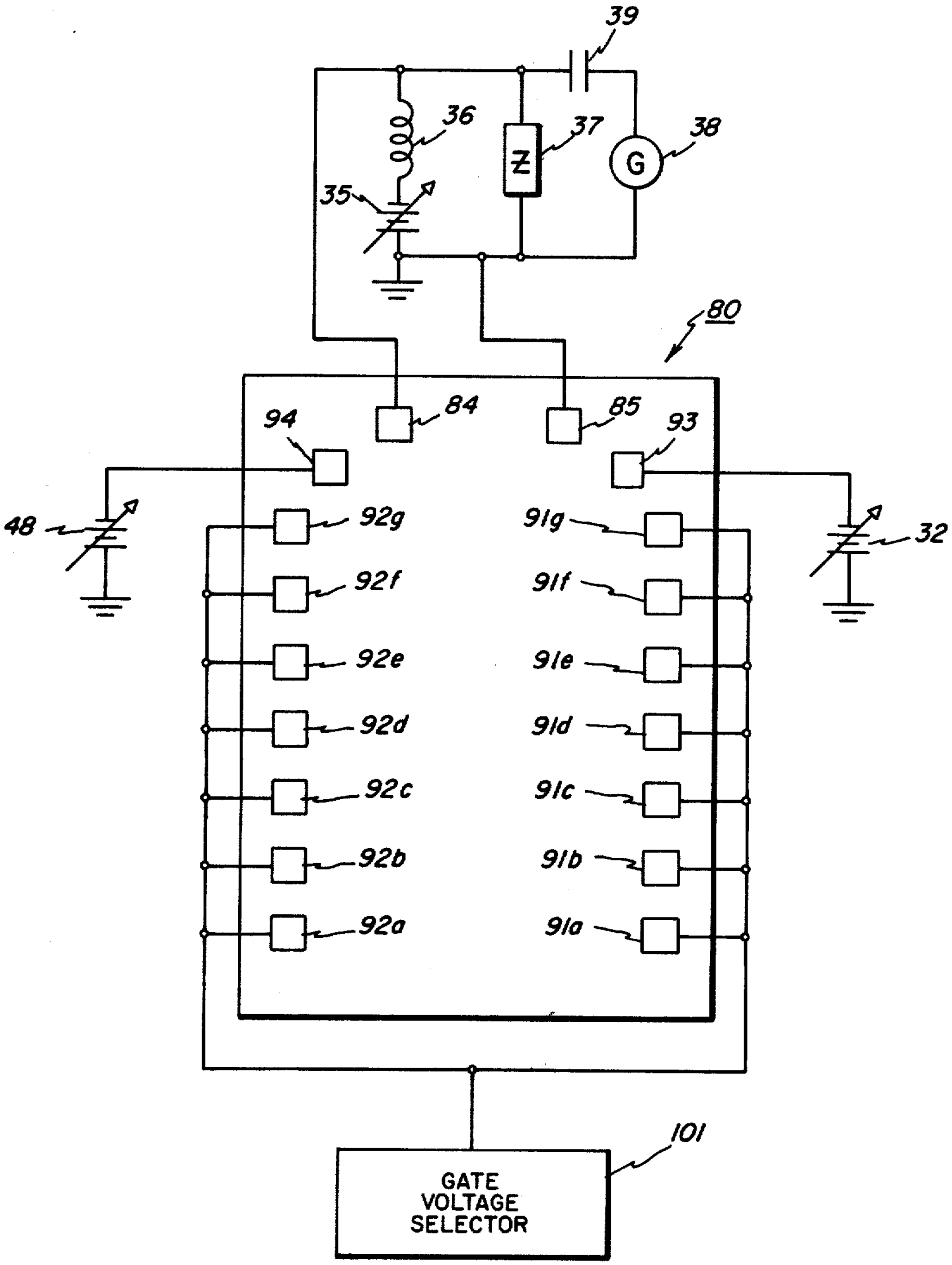

FIG. 12 shows a block diagram of a system in which the semiconductor apparatus or composite semiconductor device of FIG. 8 is incorporated to provide a plurality of discrete values of capacitance in response to preset control signals applied thereto.

Figure 2:
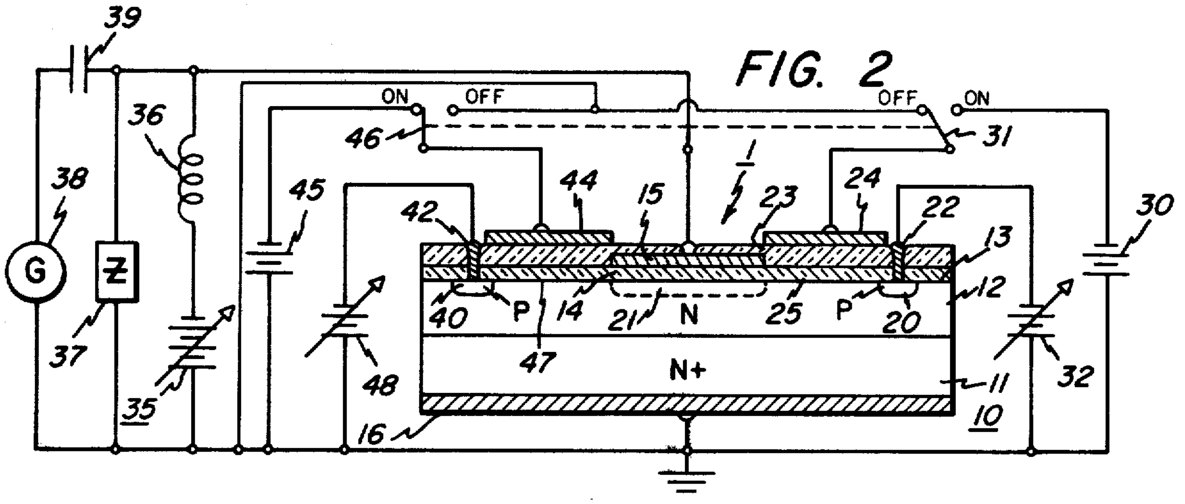
Figure 6:
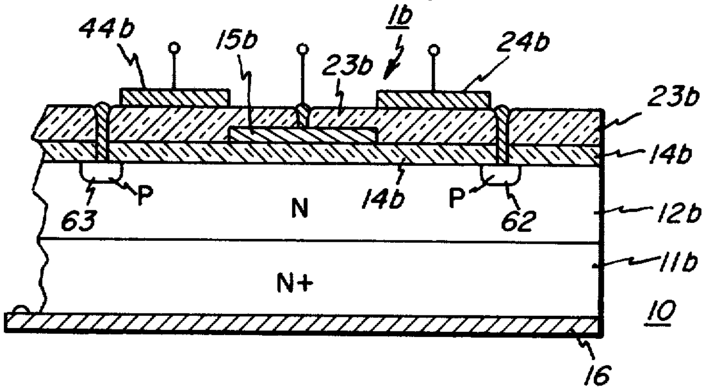
FIG. 6 is a sectional view of FIG. 4 taken along section lines 6—6 thereof.

Referring now to FIGS. 1 and 2 there is shown a semiconductor device 1 and circuit connections thereto for providing a pair of discrete values of capacitance for a high frequency signal in response to a pair of capacitance controlling potentials established in the surface adjacent regions thereof. The device is particularly useful as an element in a composite semiconductor device including a plurality of such individual devices to provide a plurality of discrete values of capacitance for a high frequency signal as will be described below in connection with FIGS. 5 and 6. A part of the device of FIGS. 1 and 2 is described and claimed in the aforementioned U.S. Pat. No. 3,808,472. The device 1 includes a body or substrate 10 of semiconductor material of one conductivity type, such as N-type silicon, for example. Conveniently, the body may be constituted of a layer 11 of low resistivity silicon and a layer 12 of silicon of substantially higher resistivity epitaxially grown thereon and providing an exposed major face or surface 13. Conveniently, the substrate 11 may be 5 mils thick and the epitaxial layer 12 may be 10 microns thick. A thin layer 14 of a suitable insulating material such as silicon oxide, for example, 1000 Angstroms thick, is provided on the major exposed face 13 of the epitaxial layer. A conductive film or plate 15 of a suitable material such as molybdenum for example, is formed on the insulating layer overlying a portion of the major surface 13 of the epitaxial layer and constitutes a first or capacitance providing electrode of the device. A conductive film or plate 16 of material makes ohmic contact with the opposite face of the substrate 10 and constitutes a second electrode of the device. Capacitance of the device is provided between the first electrode 15 and second electrode 16 of the device. A region 20 of opposite conductivity type is provided adjacent the major face of the body spaced from the surface adjacent region 21 of the epitaxial layer underlying the first electrode 15. A third electrode 22 makes conductive connection to the region 20. A layer of insulating material 23, such as silicon dioxide, is provided over the exposed surface of the insulating layer 14 and the first film 15 of conductive material. A conductive film or plate 24 of narrow and elongated form constituting a fourth electrode is provided over the layer of insulation 23 overlapping the first conductive film 15 and also overlapping the edge of the region 20. The plate 24 thus insulatingly overlies the surface adjacent portion of the region 25 between the surface adjacent region 21 and the region 20 of P-type conductivity. A depletion producing voltage may be applied from source 30 and through "on-off" switch 31 between the fourth electrode 24 and the second electrode 16 to invert the conductivity of region 25 of the semiconductor layer lying thereunder to provide a resistive channel between the surface adjacent region 21 and the third electrode 22. Another battery or source 32 of variable voltage is applied between the second electrode 16 and the third electrode 22 with the negative terminal of the source connected to the third electrode and the positive terminal connected to the second electrode. When the depletion producing voltage of source 30 is applied a control voltage from source 32 appears at the surface adjacent region 21 corresponding to one value of capacitance.

A means for producing depletion in the semiconductor layer 12 is provided in the form of a variable voltage battery 35 and a high frequency choke 36 connected in series so that the negative terminal of the battery is connected through the choke to the first electrode 15 and the positive terminal of the battery is connected to the second electrode 16. A generalized impedance 37 which may, for example, be an inductance, is connected in parallel with the capacitance appearing across the first and second electrodes to provide a tuned circuit, and a source 38 of high frequency signal is connected between the first and second electrodes through a d-c blocking capacitor 39. The potential of the source 30 is set so as to be able to produce an inversion channel of a predetermined high resistance between the surface adjacent region 21 and the region 20. When the switch 31 is closed a high resistance channel is provided between the third electrode 22 and the surface adjacent region 21 and the device provides one value of capacitance to a high frequency signal in a manner to be explained below in connection with FIGS. 3 and 4.

A region 40 of opposite conductivity type is provided adjacent the major surface of the body 10 spaced from the surface adjacent region 21 underlying the first electrode 15. A fifth electrode 42 makes conductive connection to the region. A conductive film or plate 44 of narrow and elongated form constituting the sixth electrode is provided over the layer of insulation 23 overlapping the first conductive film 15 and also overlapping the edge of the region 40. A depletion producing voltage may be applied from source 45 and through "on-off" switch 46 between the sixth electrode 44 and the second electrode 16 to invert the conductivity of region 47 of the semiconductor layer lying thereunder to provide a resistive channel between the surface adjacent region 21 and the fifth electrode 42. Voltage from variable voltage source 48 is applied between the second electrode 16 and the fifth electrode 42 with the negative terminal of the source connected to the fifth electrode and the positive terminal connected to the second electrode. When the depletion producing voltage is applied a control voltage from source 48 appears at the surface adjacent region 21 corresponding to another value of capacitance. The potential of the source 45 is set so as to be able to produce an inversion channel of a predetermined high resistance between the surface adjacent region 21 and the region 40. Switches 31 and 46 are ganged together so that inversion of only one of regions 25 and 47 can occur at a time and hence potential from only one of the sources 30 and 45 is applied to the surface adjacent region 21 at one time. When the switch 46 is closed and switch 31 is open, a high resistance channel is provided between the fifth electrode 42 and the surface adjacent region 21 and the device provides another value of capacitance to a high frequency signal in a manner to be explained below in connection with FIGS. 3 and 4.

Figure 3:
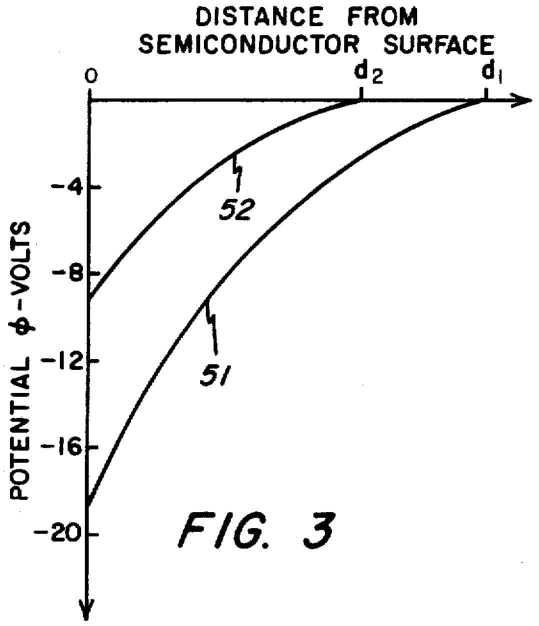

Reference is now made to FIG. 3 which shows a pair of graphs 51 and 52, each representing the distribution of potential in the semiconductor of a conductor-insulator-semiconductor (CIS) capacitor, from one extreme value at the surface of the semiconductor insulatingly underlying the conductor to another extreme value at the maximum depletion depth for a given depletion producing voltage applied between the electrodes of the capacitor. The graphs in this figure are for a CIS capacitor in which the semiconductor layer is a uniform N-type conductivity of 5 ohm-cm resistivity, in which the insulation layer is 1000 Angstroms of silicon dioxide and in which the conductor or plate is constituted of molybdenum and is biased −20 volts with respect to the semiconductor layer. At this value of bias potential the CIS capacitor is biased beyond the threshold voltage (i.e. the voltage at which minority carriers generated in the semiconductor layer accumulate at the surface and invert the conductivity type of the surface adjacent region. The threshold voltage is defined more precisely as the voltage at which the conduction and valence bands of the semiconductor are bent such that the potential difference between the valence band at the surface and the bulk Fermi level is equal to the potential difference between the conduction band and the bulk Fermi level schematically indicated as line 59 in FIG. 4. The potential of the surface adjacent region 21 in relation to the bulk of the substrate layer 12 at the values of operating voltage applied between the first and second electrodes is influenced by work function effects between conductor and insulator and between the insulator and semiconductor and by the fixed charge in the insulation near the semiconductor surface. As is well known to those skilled in the art, these effects may be made small so that they account for a shift in bias of less than one volt. With a voltage of −20 volts instantaneously applied to the CIS capacitor the surface potential becomes −17.5 volts and the surface charge density is zero, the potential distribution in the depletion region is as indicated in graph 51 from approximately −17.5 at the surface to zero at $d_1$, the distance to which the semiconductor layer is depleted of majority carriers. After a short period of the time minority carriers thermally generated in the semiconductor layer accumulate at the surface. When the charge density at the surface is $2 \times 10^{12}$ carriers (holes) per square centimeter, the potential in the depletion region varies from approximately −8 volts at the surface to zero at distance $d_2$ which is less than the distance $d_1$, as indicated in graph 52.

The portion of the device of FIG. 2 including the semiconductor layer 12, the insulating layer 14, the first and second electrodes 15 and 16 is a CIS capacitor such as described above. The potential of the surface adjacent region 21 underlying the first electrode is controlled by the potential applied to the third electrode 22 as it is connected to the surface adjacent region by high resistance channel region 25. In such a structure, the capacitance appearing across the first and second electrodes is determined by the potential appearing on the third electrode. The capacitance appearing across the first and second electrodes is determined by the dielectric layers between them, that is, by the insulating layer between the first electrode 15 and the surface of the semiconductor layer 12, and by the depletion region produced in the surface adjacent region 21. With the operating voltage across the first and second electrodes constant, variation of the potential applied to the third electrode from −17.5 volts to zero at a slow rate would cause the capacitance across the first and second electrodes, as measured by use of a small amplitude high frequency signal, to vary from a minimum value consisting of a small depletion capacitance in series with the dielectric capacitance, to a maximum value corresponding to a large depletion capacitance in series with the constant dielectric capacitance. Of course, with a bias potential of −8 V applied to the control electrode 22 the depletion capacitance corresponding to distance $d_2$ is intermediate the extreme values of depletion capacitance and hence the extreme values of the resultant capacitance. For the condition of zero voltage applied to the control electrode the relatively large capacitance obtained by the small depletion region in series with the insulator dielectric is the equilibrium capacitance which would be obtained if no control electrode were present, and sufficient time were allowed for the surface to come to equilibrium with the bulk Fermi level. This capacitance, often referred to as $C_{min}$ because it is the lowest value obtained in the usual capacitance versus voltage plot, is not the minimum but rather the maximum value of capacitance obtained when the control electrode is operated with negative potentials.

When an alternating signal of small amplitude and low in frequency is applied between the first and second electrodes of the device 10 with a fixed potential on the third electrode, charge is cycled into and out of the surface adjacent region over the resistive channel region 20. When the frequency of the small amplitude alternating voltage signal is large in relation to the time constant of the channel region and the depletion capacitance of the surface adjacent region 21, the bias source 32 is decoupled from the surface adjacent region 21 and charge is not cycled into and out of the surface adjacent region to a significant extent, particularly if the frequency of the small amplitude alternating voltage signal is very large in relation to the aforementioned time constant. If the number of minority carriers generated in the semiconductor layer over a period of the high frequency signal is relatively small, the capacitance appearing between the first and second electrodes will be substantially constant, varying only slightly due to small changes of the capacitance versus operating voltage. The aforementioned time constant is substantially shorter than the time required for minority carriers to accumulate in the surface adjacent region upon application of the indicated potentials between the first and second electrodes in a structure not containing the channel region and the third electrode. The value of the capacitance between the first and second electrodes can be changed by changing the potential applied to the third or control electrode or by gating in another electrode such as the sixth electrode 42 of FIG. 2 and gating out the third electrode. This would cause a change of the surface potential of the surface adjacent region in accordance with the time constant of the control circuit including the resistance of the channel region and the depletion capacitance of the surface adjacent region. This time constant would be short enough to permit change in capacitance in response to the applied control voltage to satisfy the requirements of the system in which it is to be used, for example, in television channel selection circuits it should take a fraction of a second to avoid any noticeable delay in the response of the system to a change in control voltage. Thus, a means is provided for controlling the capacitance appearing across the first and second electrodes thereof by the potential applied to a third electrode under the conditions indicated i.e. the time constant of the depletion capacitance and the resistance of the channel region is set to be significantly shorter than the time it takes for sufficient minority carriers to be generated in the surface adjacent region to alter appreciably the surface potential of the surface adjacent region and to be substantially longer than the period of the high frequency signal.

Figure 4:
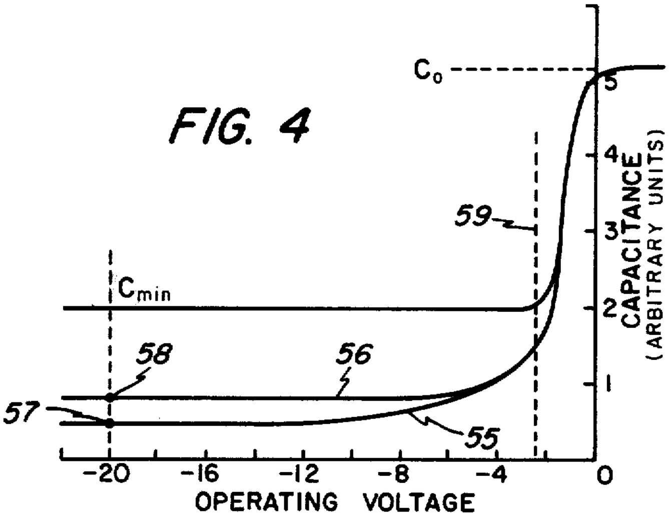

Reference is now made to FIG. 4 which shows a pair of graphs 55 and 56, each illustrating the manner in which the capacitance between the first and second electrodes of the device of FIG. 2 varies as a function of d-c operating voltage applied between the first and second electrodes for a respective capacitance control voltage applied between the second and third electrodes, or between the second and fifth electrodes of the device of FIG. 2. Graph 55 shows the manner in which the capacitance varies with operating voltage when the control voltage is −17.5 or more negative and graph 56 shows the manner in which the capacitance varies with operating voltage when the control voltage is −8 volts. If the operating voltage provided by battery 35 is set at −20 volts and the control voltage from variable source 32 (or source 48) is set at −17.5, the lowest capacitance would be represented by point 57 on graph 55 corresponding to the largest depletion width. If the control voltage is set at −8 volts the capacitance would be represented by point 58 on graph 56. When the capacitor is operated along curve 55, the capacitor is operated in its fully depleted mode. In this mode no surface charge is present and the low capacitance value such as represented by point 57 is dependent on the operating voltage. In the non fully depleted mode some surface charge is present and the low capacitance value is almost independent of the operating voltage. As the control voltage from source 32 is further decreased toward zero, the capacitance increases until at substantially zero control voltage the capacitance is at its highest value corresponding to the $C_{min}$ equilibrium value. For a device constituted of N-type conductivity silicon semiconductor layer of $10^{15}$ net donor activator concentration corresponding to a resistivity of about 5 ohm-cms., a silicon dioxide insulating layer 1000 Angstroms thick, a first electrode having an area 250 square mils, an operating potential of −20 V applied between the first and second electrodes and a control voltage of −14 applied to the third electrode with respect to the second electrode, a capacitance of 8 picofarads is obtained. When the control voltage is changed to −8 volts a capacitance of 10 picofarads is obtained. At zero volts the capacitance approaches the equilibrium capacitance $C_{min}$ of 20 picofarads.

In the operation of the device of FIG. 2, the potential of source 32 may be set to provide a capacitance represented by graph 56 at the output terminals of the device and the potential of the source 48 may be set to provide a capacitance represented by graph 57. With an operating voltage of 20 volts between the first and second electrodes from source 35 and with switch 46 closed and switch 31 open a capacitance corresponding to point 57 is obtained. When switch 31 is closed and switch 46 is open a capacitance corresponding to point 58 is obtained. High frequency signal voltages from source 38 applied in circuit with the first and second electrodes being small in amplitude in relation to the applied operating voltage and of high frequency do not have appreciable effect on the capacitance appearing between the first and second electrodes of the device.

Reference is now made to FIG. 5 which shows an embodiment of the present invention including a pair of semiconductor devices 1*a* and 1*b*, such as shown in FIGS. 1 and 2, which are connected in a manner to provide a plurality of discrete values of capacitance in response to control signals applied thereto. The devices 1a and 1b are formed on a common substrate 10 and are identical to the device of FIGS. 1 and 2. Corresponding elements of each of the devices are correspondingly designated with the identical numerical references as in FIGS. 1 and 2 followed by differentiating literal subscripts. The subscript *a* is used for the elements of device 1*a* and the subscript *b* is used for the elements of device 1*b*. The capacitance providing electrodes 15*a* and 15*b* of the devices 1*a* and 1*b* are electrically connected by a conductive connection 61 which is spaced from the substrate so that when operating potential is applied to the plates the electric field produced thereby does not alter the conductivity of the substrate. The devices 15*a* and 15*b* are located side by side with the third electrodes thereof on one side and the fifth electrodes thereof on the other side of the same face of the substrate. The third control electrodes 22*a* and 22*b* of the devices are interconnected by a P-type conductivity region 62 in the substrate 10 and similarly the fifth control electrodes 42*a* and 42*b* are connected by P-type conductivity region 63 in the substrate 10. As in the circuit of FIG. 2, a variable voltage source shown as a battery 35 and a high frequency choke 36 are connected in series with the positive terminal of the battery 35 connected to ground and to the second electrode 16 of the devices 1*a* and 1*b* and the remote terminal of the choke 36 connected to the first terminal of the devices. Variable voltage source 32 provides control potential for the surface adjacent regions of the devices 1*a* and 1*b* and has its positive terminal connected to the second electrode 16 and its negative terminal connected to the third electrodes 22*a* and 22*b* of the devices to set the high value of capacitance thereof. Similarly battery 48 has its positive terminal connected to the fifth electrodes 42*a* and 42*b* of the devices to set the low value of capacitance thereof. Voltage source 30 provides gating voltage to the four gating electrodes 24*a*, 24*b*, 44 *a* and 44*b* of the devices through respective switches 64, 65, 66 and 67. The positive terminal of the source 30 is connected to ground and the negative terminal thereof is connected to one terminal of each of the off-on switches 64–67. The other terminals of switches 64–67 are connected, respectively, to gating electrodes 24*a*, 44*a*, 24*b* and 44*b*. The switches 64 and 65 are mechanically interlocked as indicated by a dotted line and set so that when one switch is open the other is closed and accordingly only one of the potentials applied to the third electrode 22*a* and fifth electrode 42*a* may be applied to the surface adjacent region of the device 1*a*. Similarly, the switches 66 and 67 are mechanically interlocked as indicated by another dotted line and set so that when one is open and the other is closed and accordingly only one of the potentials applied to the third electrode 22*b* and fifth electrode 42*b* may be applied to the surface adjacent region of the device 1*b*. In the semiconductor apparatus of FIG. 5, there are four possible combinations of switch positions which establish four possible combinations of potentials in the surface adjacent regions of the devices 1*a* and 1*b*, and accordingly four values of capacitance, two of which are identical as the areas of plates 15*a* and 15*b* are identical, are provided between the first and second electrodes of the composite device.

The aforementioned three values of capacitance are illustrated in capacitance versus voltage graphs 71, 72 and 73 of FIG. 7 to which reference is now made. When switches 65 and 67 are closed corresponding to the application of a large negative voltages to the surface adjacent region of the devices 15*a* and 15*b*, and of course with the switches 64 and 66 opened, the minimum or lowest capacitance obtainable across the interconnected first electrodes of the composite device and the common second electrodes of the device is obtained as illustrated in graph 71. The minimum capacitance is twice the minimum capacitance of a single device, as the devices are assumed to be identical, that is, the areas of the plates 15*a* and 15*b* thereof are identical and the areas are identically spaced with respect to the substrate layer 12. With switches 64 and 67 closed so that the device 1*a* is in its high capacitance state, and device 1*b* is in its low capacitance state, the capacitance presented across the common first electrodes and the second electrode of the apparatus is represented by graph 72 where the increment of the capacitance, for example, on operating potential line 74, is the same as the increment of capacitance between the low capacitance state and the high capacitance state of one of the devices. With both switches 64 and 66 closed, both devices 1*a* and 1*b* are in their high capacitance states and total capacitance is represented by graph 73. Thus, in response to three combinations of switch positions three discrete levels of capacitance are provided at the output terminals of the composite device. One value is a minimum or low value, the other value is a maximum or high value and the third value is intermediate the high and low values. While the four switches were used for applying potentials to the gate electrodes of the apparatus, it is apparent that a pair of complementary gating signals could be alternatively applied to the gating electrodes 24*a* and 44*a* and similarly a pair of complementary gating signals could be alternatively applied to the gating electrodes 24*b* and 44*b* to control the capacitance provided by the apparatus. If the area of plate 15*b* were twice the area of plate 15*a*, it is apparent that for the four combinations of switch positions four unique evenly spaced levels of capacitance would be provided.

Reference is now made to FIG. 8 which shows a plan view of a composite device 80 providing a capacitance for a high frequency signal variable in discrete increments from a minimum value to a maximum value in response to digital control signals applied to the gating electrodes thereof. Each of the devices of FIG. 8 which form the composite device are identical in form to the device of FIGS. 1 and 2. The devices are seven in number and are similarly designated along with the elements thereof by identical numerical designations to the designations used in FIGS. 1 and 2 followed by differentiating literal subscripts. The areas of the capacitance providing electrode or first electrode of each of the devices is different and ranges from an area of minimum value to one having an area of maximum value. The first electrodes 15*a*–15*g*, having areas designated respectively $A_1$ through $A_7$, are successively arranged so that the area of each successively larger first electrode is twice the area of the preceding first electrode. The first electrodes of the devices 1*a*–1*g* are equally spaced from the substrate and are interconnected over thick insulation portions thereof, as particularly illustrated in FIG. 9 and the second electrodes of the devices are interconnected. Before describing in detail the structure of the composite device 80, the manner in which the combination of the high and low level capacitances of the devices may be utilized to provide a plurality of values of capacitance from a minimum value corresponding to the sum of the low value capacitances of the capacitors when a first potential is established in all of the surface adjacent regions of the capacitors to a maximum value corresponding to the sum of the high value capacitances of the capacitors when a second potential lower in magnitude than the first potential is established in all of the surface adjacent regions of the capacitors will be described. The minimum or lowest capacitance across the output terminals of the composite device denoted $C_{low}$ may be represented by the following equation:

$$C_{low} = C_1 (A_1 + A_2 + A_3 + A_4 + A_5 + A_6 + A_7) \quad (1)$$

Also, the maximum or highest capacitance denoted $C_{high}$ may be represented as follows:

$$C_{high} = C_2 (A_1 + A_2 + A_3 + A_4 + A_5 + A_6 + A_7) \quad (2)$$

where $C_1$ is the capacitance per unit area of a device in the low capacitance state, where $C_2$ is the capacitance per unit area of a device in its high capacitance state and where $A_1$ through $A_7$ represent, respectively, the areas of the seven first electrodes arranged in sequence from the smallest to the largest in area. Subtracting equation 1 from equation 2, the following relationship is obtained:

$$C_{high} - C_{low} = (C_2 - C_1)\ (A_1 + A_2 + A_3 + A_4 + A_5 + A_6 + A_7) \quad (3)$$

From equation 3 it is readily apparent that the total capacitance $C_t$ across the output terminals of the composite capacitor may be represented by the following relationship:

$$C_t = C_{low} + \Delta C \times A_t \quad (4)$$

where $\Delta C$ is $C_2 - C_1$, the differential capacitance between the high capacitance state and the low capacitance state per unit area of any one of the semiconductor devices, where $C_{low}$ is the minimum or lowest capacitance of the composite device and where $A_t$ is equal to the total area of the first electrodes of the individual capacitor devices operating in the high capacitance state. As each successively larger area is twice the preceding area, the areas may be represented by the series 1, 2, 4, 8, 16, 32 and 64. It is readily apparent that the numbers in the above series may be combined to provide numbers in consecutive order from 0 through 127 and accordingly provide a variation in total capacitance in equal increments each increment being represented by $\Delta C \times A_1$. For example, to provide a value of capacitance which is located 11 increments or steps above the minimum capacitance of the composite device, the devices 1*a*, 1*b* and 1*d* would be put in their high capacitance state. As the areas of the first electrodes of devices 1*a*, 1*b* and 1*d* have a combined weight or sum of 11, the value capacitance obtained would be the minimum capacitance of the composite device plus 11 × the incremental capacitance represented by $\Delta C \times A_1$. The foregoing analysis disregarded slight variations of capacitance of the devices from idealized value due to edge capacitance effect. If it is desired to take edge capacitance effect into account, the areas of the first electrodes 15*a*–15*g* may be adjusted slightly so that the capacitance provided by each successive first electrode is twice the capacitance provided by the preceding first electrode.

The structure of the composite device of FIG. 8 now will be described in connection with FIGS. 9 and 10. The device 80 includes a body of semiconductor material 10 of one conductivity, such as N type silicon, for example, conveniently the body may be constituted of a substrate layer of low resistivity silicon 11 and a layer 12 of silicon of substantially higher resistivity epitaxially grown thereon and providing exposed major face or surface 13. Conveniently the layer 11 may be 5 mils thick and the epitaxial layer 12 may be 10 microns thick. A thick layer 81 of a suitable insulating material such as silicon dioxide, for example, 15,000 Angstroms thick, is formed and on the major exposed face 13 of the epitaxial layer. The thick layer of insulation is provided with a plurality of recesses 82*a*–82*g* spaced from the semiconductor surface 13 by a thin layer 14 of silicon dioxide, for example 1000 Angstroms thick. The recesses are separated from one another by portions of thick oxide 83. The recesses have areas corresponding to the desired relationship of the areas of the first electrodes 15*a*–15*g* of the semiconductor devices, as specified above. A conductive film, for example molybdenum, is formed over the thin portions of the insulating material to provide various electrodes 15*a* through 15*g* for the device including the interconnections 89 therebetween over the thick oxide portions 83 and the common capacitance providing electrode terminal 84. A terminal 85 is connected to conductive member 16 conductively connected to the opposite face of the substrate 10 and constitutes the common terminal of the devices.

An elongated P-type conductivity region 86 is located on one side of the substrate 10 adjacent surface 13 and constitutes the third electrodes of the individual devices. Another elongated P-type conductivity region 87 is located on the other side of the substrate 10 adjacent surface 13 and constitutes the fifth electrodes of the individual devices. A pair of narrow elongated channels 88 and 89 are formed in the thick layer of insulation for each of the recesses. One channel 88 extends from one side of a recess to a point overlying an adjacent edge of P-type conductivity region 86 and the other channel 89 extends from the opposite side of the recess to a point overlying the P-type conductivity region 87. Conductive members 24*a*–24*g* are formed in the channels 88 and constitute the fourth electrodes of the devices. Conductive members 44*a*–44*g* are formed in channels 89 and constitute the sixth electrodes of the devices. Each of the conductive fourth electrodes and sixth electrodes are insulatingly spaced with respect to the substrate to enable inversion of conductivity and hence to enable a resistive channel to be produced between the surface adjacent region of a respective device and the P-type conductivity region which provides the appropriate control voltage thereto. The conductive members 24*a*–24*g* and 44*a*–44*g* extend over thick oxide layer 81 beyond the P-type conductivity regions 86 and 87 and terminate in fourth and sixth electrode terminals for the individual devices. Thus, devices 1*a*–1*g* are provided with fourth gate electrodes 24*a*–24*g*, respectively, and with fourth gate terminals 91*a*–91*g*, respectively. Devices 1*a*–1*g* are also provided with sixth gate electrodes 44*a*–44*g* respectively, and with sixth gate terminals 92*a*–92*g*, respectively. Terminal 93 is connected by conductor 95 through an opening in the oxide layer 81 to region 86, the common third electrode of the devices. Similarly, terminal 94 is connected by conductor 96 through an opening in the oxide layer 81 to P region 87, the common fifth electrode of the devices. The terminal 93 is the terminal to which a high capacitance producing voltage is connected, and hence when the surface adjacent region of a device is connected through an inversion channel underlying a fourth gate electrode to such a potential, the high capacitance state of the device is obtained. The terminal 94 is the terminal to which a low capacitance producing voltage is connected, and hence when it is connected through an inversion channel underlying a sixth gate electrode to the surface adjacent region of a device it provides the low capacitance state of the device. Accordingly, it is seen that in FIG. 8 a composite semiconductor variable capacitance device 80 is provided in which the capacitance thereof is variable in equal increments from a minimum value to a maximum value through a total of 127 steps. To provide such a device a total of only 18 terminals are required, i.e. 2N + 4 terminals, where N represents the number of individual devices in the composite device.

In the operation of the composite device of FIG. 8 in apparatus such as disclosed and shown in FIG. 12, it is important that source 32 connected to the high capacitance determining terminal 93 provide constant voltage and preferably have a low internal impedance so that once a desired value of voltage is set, it remains set. It is important for voltage of source 32 to be stable as it determines the high values of capacitance of the devices of the composite device. Also, the source 48 which determines the low values of capacitance of the devices should be stable and preferably should have low internal impedance to provide voltage which does not vary as current is drawn therefrom.

Reference is now made to FIG. 11 which shows a plurality of graphs of capacitance vs operating voltage for the composite device of FIG. 8, each graph corresponding to unique combination of capacitance conditions of the individual capacitance devices of the composite capacitance device 80. The graphs are analogous to the graphs of FIGS. 4 and 7 and show the threshold voltage 98 of the device and suitable operating voltage 99 for the composite device. The device 80 has a total of 128 graphs, however for reasons of simplicity and clarity only the graph of the lowest capacitance denoted $C_{low}$ and the graph of the highest capacitance denoted $C_{high}$ and several graphs displaced therefrom by equal increments ($\Delta$ C $\times$ $A_1$) are shown.

Reference is now made to FIG. 12 which shows the composite device 80 of FIG. 8 in block form connected in circuit with other apparatus for illustrating the manner in which the capacitance of the composite device may be continuously varied in discrete steps to provide any one of a plurality of discrete values between a minimum and a maximum value in response to suitable control signals. Operating voltage is applied to the composite device by variable voltage battery 35 having its positive terminal connected to the common or second electrode terminal 85 and having its negative terminal connected through a high frequency choke 36 to the first electrode terminal 84. An impedance 37, which may be an inductance, is connected in shunt across the first and second electrode terminals 84 and 85 to form a resonant circuit with the capacitance presented thereby. A source of high frequency energy 38 is also connected between the first and second electrode terminals 84 and 85. Voltage for setting the high capacitance state of each of the devices is provided by variable voltage source 32, the positive terminal of which is connected to ground and the second electrode and the negative terminal of which is connected to the third electrode terminal 93. The voltage of source 32 may be varied to vary the high capacitance states of the individual devices of the composite device 80 and hence the maximum value of the capacitance of the device 80. Voltage source 48 having its positive terminal connected to the second electrode terminal 85 and its negative terminal connected to the fifth electrode terminal 94 provides the voltage for controlling the low capacitance state of each of the individual devices. The voltage of source 48 may be varied to vary the low capacitance states of devices and hence the minimum value of capacitance of the composite device.

The gating terminals 91*a*–91*g* and 92*a*–92*g* of the device are connected to a gate voltage selector 101. The selector may be a 128 position switch which provides a unique combination of gating voltages to the gating terminals for each position of the switch corresponding to a unique value of capacitance of device 80. As mentioned above, the voltages applied to any pair of gating terminals of a device are complementary, permitting either potential from the third electrode or the potential from the fifth electrode to appear at the surface adjacent region underlying the capacitance providing electrode of the device. The function of the gate voltage selector switch may be provided by a Read-Only Memory addressable by suitably coded signals to provide digital coded outputs, each corresponding to a respective unique value of capacitance of device 80.

The minimum capacitance of the composite device 80 is set by setting the voltage applied to the fifth electrode terminal 94. When operated in the fully depleted mode, the minimum capacitance of the composite device 80 is determined by the voltage applied to the capacitance providing electrode at terminal 84, and when operated in the non-depleted mode, the minimum capacitance is determined by the voltage applied to the fifth electrode at terminal 94. The maximum capacitance of the composite device is set by setting the voltage applied to the third electrode terminal 93. With such adjustments for a given operating voltage applied between the first and second electrode terminals 84 and 85, the increment of capacitance ($\Delta$ C $\times$ $A_1$) between successive values of capacitance is precisely set assuming that the first electrodes were formed having areas arranged in the series described above. If a capacitance device which is frequency dependent (or dependent on some other parameter) is desired to provide automatic frequency control, either or both sources 32 and either source 48 or 35 depending on mode, can be made to provide voltages which are the desired functions of frequency (or any other parameter). The composite device 80 is thus useable to provide automatic frequency control in television systems.

The minimum, and of course the maximum capacitance, of the composite device may be increased by a fixed value by shunting a capacitance of appropriate value across the first and second electrodes of the composite device. Such an arrangement would be useful to select a single channel from a band of channels whose separations are small compared to their center frequencies.

The circuit consisting of the capacitance of composite device 80 and the impedance 37 may constitute a resonant circuit useable in the preamplifier and local oscillator stages of television receivers for channel selection. In such applications, several such composite capacitors may be used in different tuned circuits, and controlled, as desired, from a common gate voltage selector or different gate voltage selectors.

While the various capacitance devices in accordance with the present invention have been shown in operative association with various circuits, it is to be understood that the circuits are shown as illustrative and are not to be construed as limiting the manner in which the devices may be used.

While in the illustrative embodiments described, the semiconductor material utilized is silicon, other semiconductor materials such as germanium and Group III-Group V compounds, such as gallium arsenide, could be used. Also, while in the illustrative embodiments described the insulating member was constituted of silicon dioxide, other insulating materials such as silicon nitride, silicon oxynitride, and aluminum oxide would be suitable. Also, the conductive plates could be constituted of any of a number of conductive materials, metallic and non-metallic such as molybdenum, tungsten, aluminum and polycrystalline silicon. In general, however, these electrodes require high conductivity so that high Q circuits may be obtained. For applications where Q is of less importance lower conductivity materials may be used.

While in the various embodiments shown and described an N-type conductivity semiconductor substrate material was specified, P-type conductivity semiconductor material could as well be used. Of course, in such a case the applied potentials would be reversed in polarity. In choosing the desired substrate conductivity type considerations of low series resistance between the first and second electrodes of the devices is important. For this reason, when the semiconductor material is silicon, an N-type substrate is preferred.

While the body of semiconductor material utilized in the devices have been shown as constituted of a strongly N-type conductivity substrate of low resistivity and an epitaxial layer of high resistivity thereon of the desired net activator concentration or resistivity, the substrate layer could be dispensed with and low resistance connection made directly to the high resistivity layer. However, the substrate layer provides a convenient starting point for forming thin high resistivity layers thereon and also for making low resistance connection thereto to provide low series resistance and hence high Q in the variable capacitance devices.

The various techniques utilized in the fabrication or formation of devices including epitaxially growing silicon layers on silicon, thermally growing silicon dioxide on silicon, forming apertures in silicon dioxide layers by photolithographic masking and etching, implanting and diffusing activators through apertures in silicon dioxide masking layers into an underlying semiconductor layer to form regions of desired conductivity type, geometry and electrical characteristics, metallizing of regions to form desired electrical connection paths and the like are all well known to those skilled in the art. Utilizing such techniques, it is readily apparent to one skilled in the various ways in which the devices of the present invention may be fabricated.

Accordingly, while the invention has been described in specific embodiments, it will be appreciated that modifications may be made by those skilled in the art and it is intended by the appended claims to cover all such modifications and changes as fall within the true spirit and scope of the invention.

What I claim as new and desire to secure by Letters Patent of the United States is:

1. Semiconductor apparatus for providing a capacitance for a high frequency signal variable in discrete increments comprising a substrate of semiconductor material of one type conductivity including a plurality of spaced surface adjacent regions, a plurality of capacitance providing electrodes, each insulatingly overlying and spaced a predetermined distance from a respective surface adjacent region of said substrate and forming with respect to a common electrode connected to said substrate a respective capacitor, said capacitance providing electrodes being connected together to provide a common capacitance providing electrode of said apparatus, means for applying a depletion producing voltage between said common capacitance providing electrode and said common electrode corresponding to a predetermined surface potential having an absolute value less than said depletion producing voltage but greater than the inversion threshold voltage of said apparatus, means for applying a high frequency signal between said common capacitance providing electrode and said common electrode control means for establishing individually in each of said surface adjacent regions a first potential in relation to said substrate corresponding to a respective low value of capacitance between a respective capacitance providing electrode and said common electrode, and for establishing alternatively and individually in each of said surface adjacent regions a second potential in relation to said substrate corresponding to a respective high value of capacitance between a respective capacitance providing electrode and said common electrode, whereby the capacitance of said device is variable in increments dependent on the particular potentials established in the surface adjacent regions of the capacitors from a minimum value corresponding to the sum of the low value capacitances of the capacitors when said first potential is established in all of the surface adjacent regions of said capacitors to a maximum value corresponding to the sum of the high value capacitances of the capacitors when said second potential is established in all of said surface adjacent regions of said capacitors.

2. The combination of claim 1 in which said control means comprises a first control electrode and means for producing a plurality of first channel regions of opposite conductivity in said substrate each connected between said first control electrode and a respective surface adjacent region, the time constant of the capacitance of each of said surface adjacent regions and the resistance of the first channel connected thereto from said first electrode being large in relation to a period of said high frequency signal, a second control electrode and means for producing a plurality of second channel regions of opposite conductivity in said substrate, each connected between said second control electrode and a respective surface adjacent region, the time constant of the capacitance of each of said surface adjacent regions and the resistance of the second channel region connected thereto from said second electrode being large in relation to a period of said high frequency signal, means for providing said first potential to said first control electrode and for providing said second potential to said second control electrode, channel establishing means for individually and alternatively establishing the channel regions connected to each of said surface adjacent regions.

3. The combination of claim 2 in which said channel establishing means comprises a plurality of first gate electrodes, each spaced in insulated relationship to said substrate to provide a respective first channel region when energized, and a plurality of second gate electrodes, each spaced in insulated relationship to said substrate to provide a respective second channel region when energized, means for alternatively energizing each pair of gate electrodes.

4. The combination of claim 1 in which the areas of said capacitance providing electrodes are consecutively arranged according to size into a series, each area of the series starting with the second being set in relation to the preceding area of the series to provide twice the capacitance thereof.

5. Semiconductor apparatus for providing a plurality of discrete values of capacitance for a high frequency signal comprising a pair of semiconductor devices, each including a body of semiconductor material of one type conductivity having a major surface, a conductive member insulatingly overlying a first surface adjacent region of said body and constituting a first capacitance providing electrode of said device, conductive means in electrical contact with another region of said body and forming a second electrode of said device, the first capacitance providing electrodes of said devices being connected together and the second electrodes of said devices being connected together, means for applying a depletion producing voltage between said common capacitance providing electrodes and said common electrode corresponding to a predetermined surface potential having an absolute value less than said depletion producing voltage but greater than the inversion threshold voltage of said apparatus, means for applying a high frequency signal between said common capacitance providing electrode and said common electrode, means for establishing alternatively, in each of the surface-adjacent regions of said devices of different potentials corresponding to different values of capacitance between said first and second electrodes of a respective device, means for preselecting the combination of predetermined potentials simultaneously established in said surface adjacent regions, whereby discrete values of capacitance are obtained between said first and second electrodes of said devices each corresponding to a respective combination of potentials established in the surface adjacent regions of said devices.

6. The combination of claim 5 in which said devices include a common body of semiconductor material having a major surface and in which each of said first electrodes are spaced a predetermined distance from said major surface.

7. The combination of claim 6 in which the different potentials established in a surface adjacent region of a device are two in number and are identical for each of the devices.

8. The combination of claim 5 in which the area of the first electrode of one device is twice the area of the first electrode of the other device.

9. A semiconductor device for providing a pair of discrete values of capacitance for a high frequency signal comprising a body of semiconductor material of one type conductivity, a first conductive member insulatingly overlying a surface adjacent region of said body, a second conductive member in electrical contact with another region of said device, means for applying a depletion producing voltage between said first and second conductive members corresponding to a predetermined surface potential having an absolute value less than said depletion producing voltage but greater than the inversion threshold voltage of said device, a first control electrode for controlling the capacitance between said first and second conductive members, means for applying a first control potential to said first control electrode greater than said inversion threshold voltage, a first biasing means for selectively providing a first channel region of opposite type conductivity between said first control electrode and first surface adjacent region, the time constant of the capacitance of said surface adjacent region and the resistance of said second channel region being large in relation to a period of said high frequency signal, a second control electrode for controlling the capacitance between said first and second conductive members, means for applying a second control potential to said second control electrode greater than said inversion threshold voltage, a second biasing means for selectively establishing a second channel region of opposite type conductivity connected between said third electrode and said surface adjacent region, the time constant of the capacitance of said surface adjacent region and the resistance of said second channel region being large in relation to a period of said high frequency signal, means for alternatively rendering operative said first and second biasing means to establish one or the other of said discrete values of capacitance.

10. Semiconductor apparatus for providing a capacitance for a high frequency signal variable in discrete increments comprising a substrate of semiconductor material of one type conductivity including a plurality of spaced surface adjacent regions, a plurality of capacitance providing electrodes, each insulatingly spaced a predetermined distance from a respective surface adjacent region of said substrate and forming with respect to a common electrode connected to said substrate a respective capacitor, said capacitance providing electrodes being coupled together to provide a common capacitance providing electrode of said apparatus, means for applying a depletion producing voltage between said common capacitance providing electrodes and said common electrode corresponding to a predetermined surface potential having an absolute value less than said depletion producing voltage but greater than the inversion threshold voltage of said apparatus, means for applying a high frequency signal between said common capacitance providing electrode and said common electrode, control means for establishing individually in each of said surface adjacent regions a first potential in relation to said substrate corresponding to a respective low value of capacitance between a respective capacitance providing electrode and said common electrode, and for establishing alternatively and individually in each of said surface adjacent regions a second potential in relation to said substrate corresponding to a respective high value of capacitance between a respective capacitance providing electrode and said common electrode.

11. The combination of claim 10 in which the areas of said capacitance providing electrodes are consecutively arranged according to size into a series, each area of the series starting with the second being set in relation to the preceding area of the series to provide twice the capacitance thereof.

* * * * *